(12) United States Patent
Yokoi

(10) Patent No.: US 11,135,831 B2
(45) Date of Patent: Oct. 5, 2021

(54) CLEANING UNIT AND PRINTING DEVICE

(71) Applicant: FUJI CORPORATION, Chiryu (JP)

(72) Inventor: Yoshimune Yokoi, Kiyosu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/056,544

(22) PCT Filed: May 25, 2018

(86) PCT No.: PCT/JP2018/020152
§ 371 (c)(1),
(2) Date: Nov. 18, 2020

(87) PCT Pub. No.: WO2019/225004
PCT Pub. Date: Nov. 28, 2019

(65) Prior Publication Data
US 2021/0206159 A1 Jul. 8, 2021

(51) Int. Cl.
*B41F 35/00* (2006.01)
*B41F 15/12* (2006.01)
(Continued)

(52) U.S. Cl.
CPC ............ *B41F 15/12* (2013.01); *B41F 35/005* (2013.01); *B41P 2235/24* (2013.01);
(Continued)

(58) Field of Classification Search
CPC ..................................................... B41F 35/005
(Continued)

(56) References Cited

U.S. PATENT DOCUMENTS 5,701,821 A * 12/1997 Asai ...................... B41F 35/005
101/424
6,036,787 A * 3/2000 Bennett ................. B41F 35/005
101/423
(Continued)

FOREIGN PATENT DOCUMENTS

| JP | 2005-199452 A | 7/2005 |
|---|---|---|
| JP | 2015-16571 A | 1/2015 |
| WO | WO 2014/030212 A1 | 2/2014 |

OTHER PUBLICATIONS

International Search Report dated Jul. 3, 2018 in PCT/JP2018/020152 filed on May 25, 2018, 2 pages.

*Primary Examiner* — Anthony H Nguyen
(74) *Attorney, Agent, or Firm* — Oblon, McClelland, Maier & Neustadt, L.L.P.

(57) ABSTRACT

A cleaning unit includes a cleaning head that moves a cleaning member, which cleans the screen mask at the cleaning position, a cleaning member holder that supports a first shaft and a second shaft, over which the cleaning member is bridged, and has an opening section allowing the cleaning head to pass therethrough, a base section that detachably fixes the cleaning member holder at a fixing position, a holder moving section that moves the cleaning member holder between the fixing position of the base section and a replacing position where the cleaning member holder is detached from the base section and is unloaded to an outside, and a cleaning driving section that has a connecting section, which is connected and disconnected to and from the first shaft in the cleaning member holder, and drives the first shaft to wind.

8 Claims, 5 Drawing Sheets

(51) Int. Cl.
*H05K 3/34* (2006.01)
*H05K 3/12* (2006.01)

(52) U.S. Cl.
CPC ........ *B41P 2235/50* (2013.01); *H05K 3/1216* (2013.01); *H05K 3/34* (2013.01)

(58) Field of Classification Search
USPC ........................................................ 101/425
See application file for complete search history.

(56) References Cited

U.S. PATENT DOCUMENTS

| | | | |
|---|---|---|---|
| 6,237,484 B1* | 5/2001 | Homma | B41F 35/005 101/114 |
| 6,955,121 B2* | 10/2005 | Perault | B41F 35/005 101/129 |
| 2014/0047990 A1* | 2/2014 | Fujii | B41F 15/0881 101/123 |
| 2015/0009524 A1* | 1/2015 | Fujimoto | G06K 15/40 358/1.14 |

* cited by examiner

CLEANING UNIT AND PRINTING DEVICE

TECHNICAL FIELD

The present specification discloses a cleaning unit and a printing device.

BACKGROUND ART

Conventionally, for example, in a printing device that performs a viscous fluid printing process on a printing target, such as a board, using a screen mask, a printing device that includes a cleaning unit having an abutting member, in which a contact section abutting against a bottom surface of the screen mask is formed, has been proposed (for example, refer to Patent Literature 1). The cleaning unit is configured to be capable of performing both of a squeegee end surface cleaning process and a screen cleaning process.

PATENT LITERATURE

Patent Literature 1: JP-A-2015-016571

BRIEF SUMMARY

Technical Problem

However, although a cleaning member that cleans the screen mask is a consumable and thereby replacement is necessary in the cleaning unit described above, the replacement has not been particularly considered. Although it is desirable to automatically perform the replacement of the cleaning member by, for example, a robot, such a structure has not been examined.

The present disclosure is devised in view of such problems, and a main object thereof is to provide a cleaning unit and a printing device, in which a cleaning member used for a printing device can be more easily exchanged.

Solution to Problem

The cleaning unit and the printing device, which are disclosed in the present specification, adopt the following means in order to achieve the main object described above.

A cleaning unit of the present disclosure is used for a printing device configured to perform a viscous fluid printing process on a printing target using a screen mask, the cleaning unit includes a cleaning head configured to move a cleaning member for cleaning the screen mask between a cleaning position where the cleaning member is brought into contact with the screen mask and a standby position, and to clean the screen mask at the cleaning position, a cleaning member holder configured to support a first shaft and a second shaft, over which the cleaning member is bridged, the cleaning member holder having an opening section allowing the cleaning head to pass therethrough, a base section configured to detachably fix the cleaning member holder at a fixing position, a holder moving section configured to move the cleaning member holder between the fixing position of the base section and a replacing position where the cleaning member holder is detached from the base section and is unloaded to an outside, and a cleaning driving section having a connecting section configured to connect and disconnect to and from the first shaft of the cleaning member holder, the cleaning driving section driving the first shaft to wind.

In the cleaning unit, the cleaning member holder, that supports the first shaft and the second shaft, over which the cleaning member cleaning the screen mask is bridged, and has the opening section allowing the cleaning head to pass therethrough, is detachably fixed at the fixing position to the base section. Then, when cleaning the screen mask, the cleaning unit causes the cleaning head to pass through the opening section formed in the cleaning member holder to bring the cleaning member into contact with the screen mask, and causes the cleaning driving section to drive the cleaning member to wind, thereby cleaning the screen mask. On the other hand, when exchanging the cleaning member, the cleaning unit disconnects the cleaning driving section with the connecting section, and causes the holder moving section to move the cleaning member holder that supports the first shaft and the second shaft, over which the cleaning member is bridged, to the replacing position. At this time, since the cleaning head passes through the opening section and separates away from the cleaning member holder, the cleaning member holder is in a free state. Then, in the cleaning unit, since it is possible to replace the cleaning member together with cleaning member holder, the cleaning member used for the printing device can be more easily exchanged. Herein, examples of the "printing target" include a board and a three-dimensional object on which a component is mounted. In addition, examples of the "viscous fluid" include solder paste, conductive paste, and adhesive. In addition, an example of the cleaning member includes cleaning paper.

DESCRIPTION OF EMBODIMENTS

Figure 1:
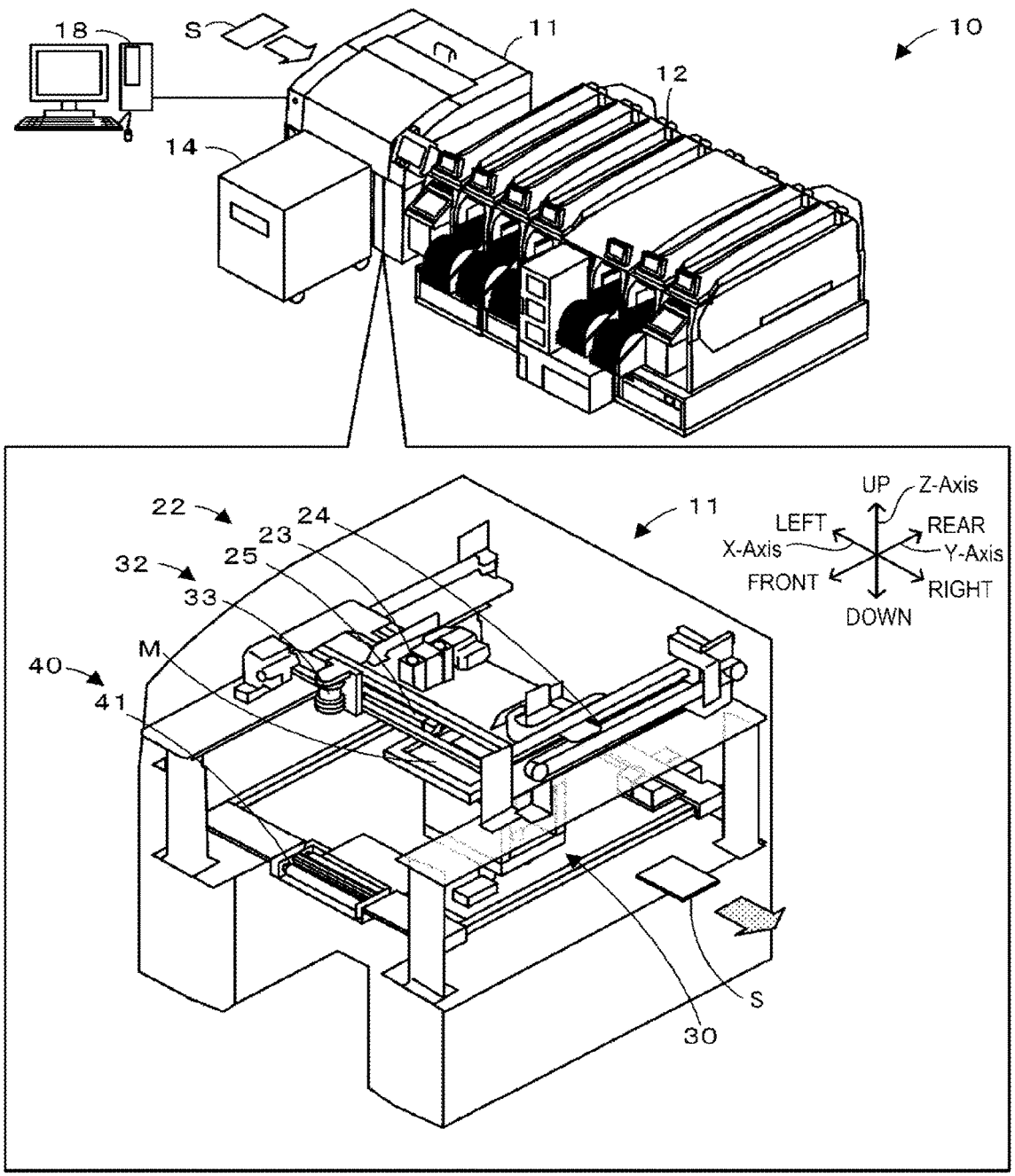
FIG. 1 is a schematic explanatory view showing an example of mounting system 10.
Figure 2A:
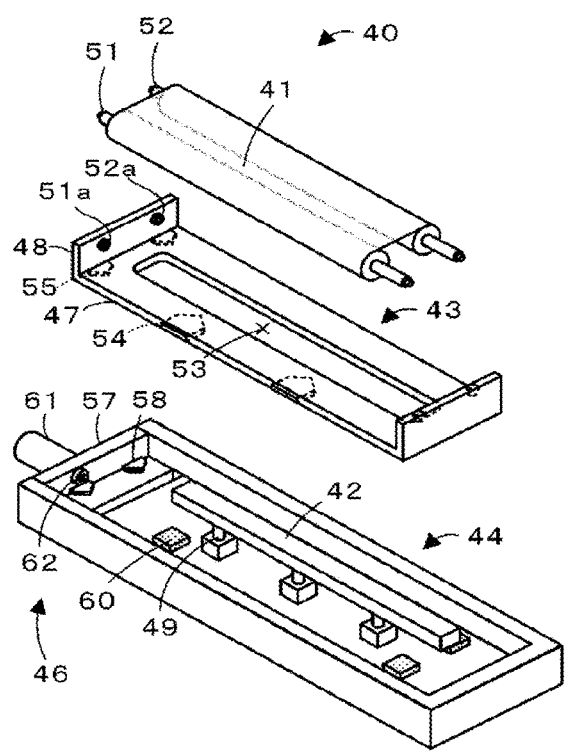
FIG. 2 is an explanatory view showing an example of a configuration of cleaning section 40.
Figure 2B:
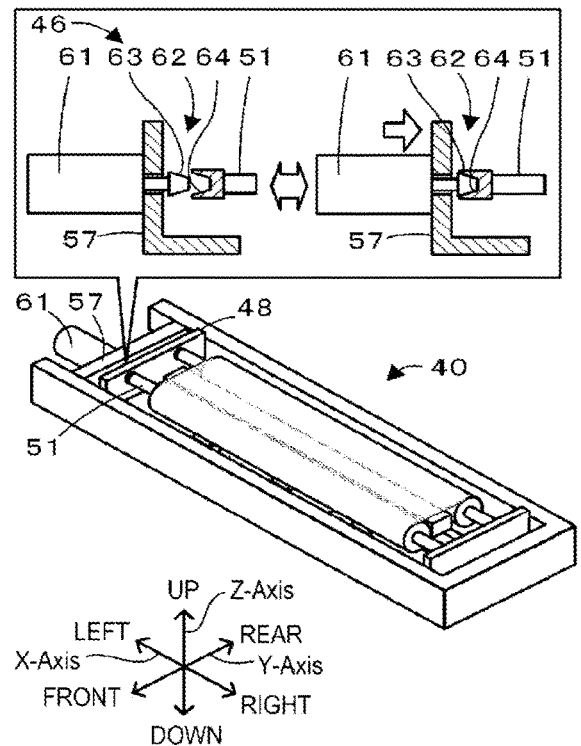
Figure 3:
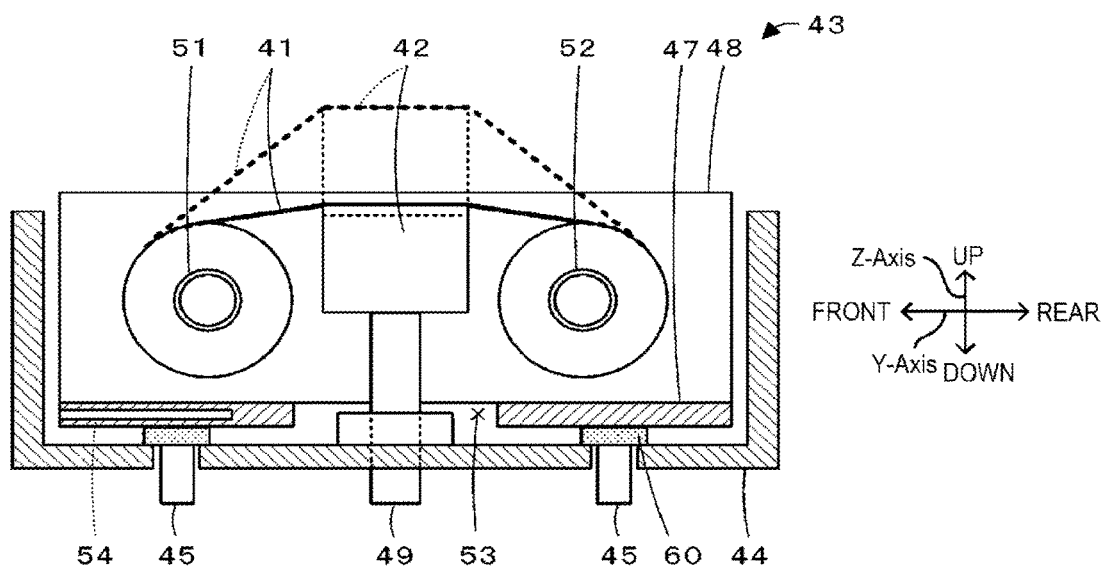
FIG. 3 is a partial sectional view viewed from a side surface of cleaning section 40.
Figure 4:
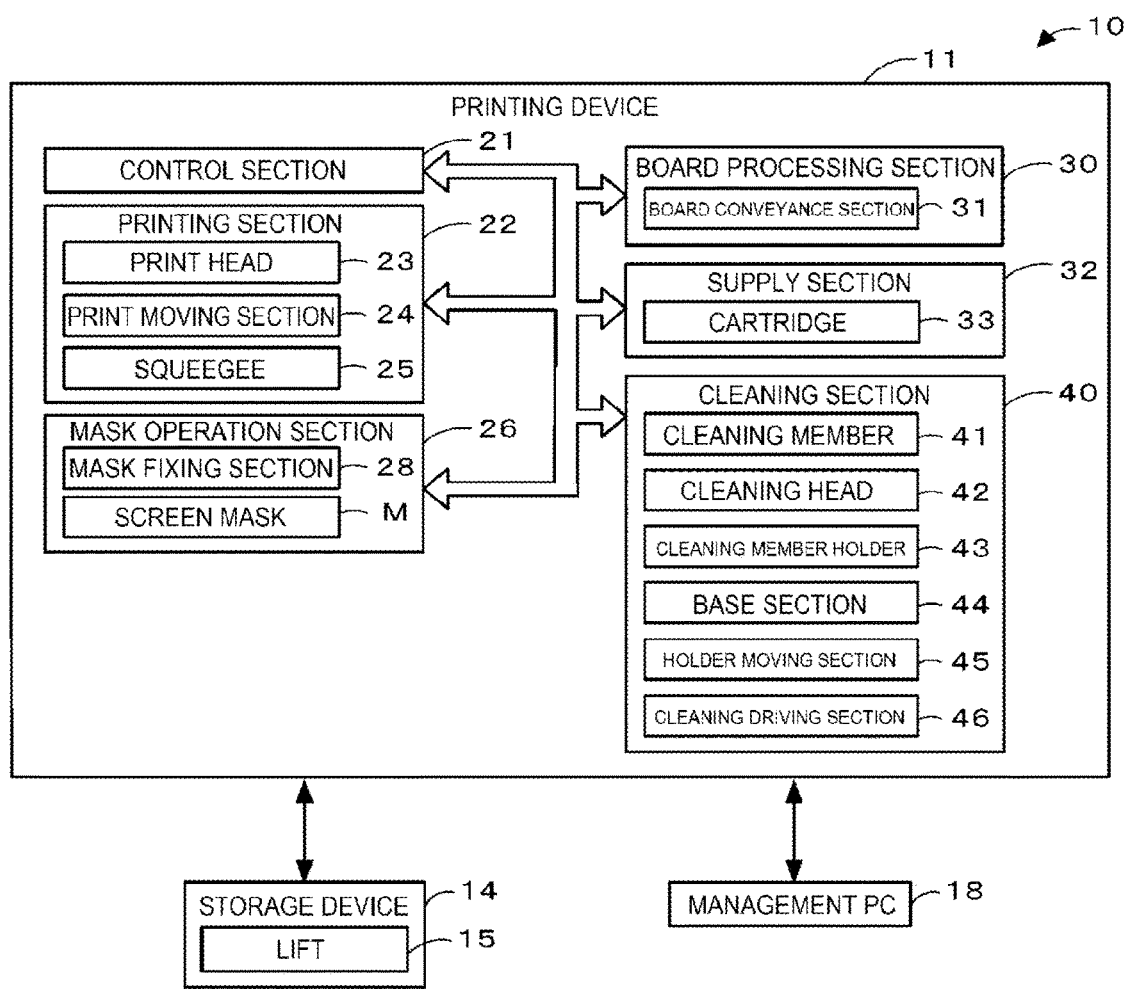
FIG. 4 is a block diagram showing an electrical connection relationship of printing device 11.

The present embodiment will be described below with reference to the drawings. FIG. 1 is a schematic explanatory view showing an example of mounting system 10 including printing device 11 which is an example of the present disclosure. FIG. 2 is an explanatory view showing an example of a configuration of cleaning section 40; FIG. 2A is an exploded perspective view, and FIG. 2B is a perspective view. FIG. 3 is a partial sectional view viewed from a side surface of cleaning section 40. FIG. 4 is a block diagram showing an electrical connection relationship of printing device 11. Mounting system 10 is, for example, a system for mounting a component on board S. Mounting system 10 includes printing device 11, mounting device 12, storage device 14, and management computer (PC) 18. Mounting system 10 is configured as a mounting line in which multiple mounting devices 12 that mount components on board S are disposed on a downstream side of printing device 11. In the present embodiment, a right-left direction (X-axis), a front-rear direction (Y-axis), and an up-down direction (Z-axis) are as shown in FIGS. 1 to 3 and FIGS. 5 and 6.

Mounting device 12 is a device that mounts a component on board S, on which viscous fluid such as solder paste is printed by printing device 11. Storage device 14 is a device that stores an exchange target object to be used for printing device 11 and load and unload the exchange target object to and from printing device 11. Storage device 14 is disposed in front of printing device 11. Storage device 14 loads and unloads the exchange target object with lift 15 protruding outward from the inside of a storage (refer to FIGS. 4 and 6). Herein, examples of the "exchange target object" include cartridge 33 accommodating viscous fluid, squeegee 25, cleaning member 41 used for cleaning screen mask M, and a support member (board support member) that fixes a printing target, in addition to screen mask M. Herein, a configuration of automatically exchanging cleaning member 41 will be described. Management PC 18 is a device that manages information of each device of mounting system 10. Management PC 18 manages the progress state of each device of the mounting line. Each device of mounting system 10 exchanges information with management PC 18 and acquires information such as the progress states of other devices.

As shown in FIGS. 1 and 4, printing device 11 is a device that by pushing solder on screen mask M into a pattern hole formed in screen mask M with the use of squeegee 25, applies (prints) the solder, which is viscous fluid, to board S below, which is a printing target, via the pattern hole. Examples of the "printing target" include board S and a three-dimensional object on which a component is mounted. Examples of the "viscous fluid" include solder paste, conductive paste, and adhesive. Herein, board S and solder will be described below as examples. Printing device 11 includes control section 21 (refer to FIG. 4), printing section 22, mask operation section 26, board processing section 30, supply section 32, and cleaning section 40. Control section 21 is configured as a microprocessor centered on a CPU, and controls entire printing device 11.

Printing section 22 is a unit that is disposed at an upper stage of printing device 11 and performs a viscous fluid printing process on board S using screen mask M. Printing section 22 includes printing head 23, printing moving section 24, a squeegee lifting and lowering section, and squeegee 25. Printing moving section 24 moves printing head 23 in a predetermined printing direction (herein, the front-rear direction), and includes a guide formed in the front-rear direction, a slider that moves along the guide, and a motor that drives the slider. Squeegee 25 is disposed on a lower surface side of printing head 23 and is lifted and lowered by the squeegee lifting and lowering section. Printing section 22 has two squeegees 25 each used for the front-rear direction. Mask operation section 26 is a unit that is disposed between printing section 22 and board processing section 30 in the up-down direction and fixes and holds screen mask M. As shown in FIG. 4, mask operation section 26 includes mask fixing section 28. Mask fixing section 28 positions screen mask M and supports and fixes screen mask M in a horizontal posture. As shown in FIG. 1, board processing section 30 is a unit that is disposed below mask operation section 26, loads board S, positions and supports loaded board S, and comes into contact with or separates away from screen mask M. Board processing section 30 includes board conveyance section 31 that conveys board S in the right-left direction, a board support member that supports board S from below, and a board lifting and lowering section that lifts and lowers entire board processing section 30 and the board support member. Supply section 32 is a unit that supplies solder accommodated in cartridge 33 onto screen mask M. Supply section 32 is disposed in front of printing head 23. Supply section 32 applies a pressure to cartridge 33 such that the solder is discharged from cartridge 33.

As shown in FIGS. 1 to 4, cleaning section 40 is a unit that is disposed between mask operation section 26 and board processing section 30 in the up-down direction and performs a cleaning process of cleaning a bottom surface of screen mask M. Cleaning section 40 has cleaning member 41, and cleaning member 41 cleans screen mask M. An example of cleaning member 41 includes cleaning paper. Cleaning section 40 includes cleaning head 42, cleaning member holder 43, base section 44, holder moving section 45, and cleaning driving section 46.

Cleaning head 42 is a member that cleans screen mask M by bringing cleaning member 41, which cleans screen mask M, into contact with screen mask M. Cleaning head 42 is a rod-like member having a rectangular parallelepiped shape whose longitudinal direction is an X-axis direction (right-left direction). Cleaning head 42 is moved between a cleaning position (refer to a dotted line of FIG. 3) and a standby position (refer to a solid line of FIG. 3) by head moving section 49, and cleans screen mask M at the cleaning position. Cleaning head 42 is lifted and lowered to bring cleaning member 41 into contact with screen mask M from a lower surface side thereof.

Cleaning member holder 43 is a member that supports cleaning member 41. Cleaning member holder 43 is loaded and unloaded to and from printing device 11 by lift 15 of storage device 14. Cleaning member holder 43 is a member that supports first shaft 51 and second shaft 52, over which cleaning member 41 is bridged, and has opening section 53, through which cleaning head 42 can pass. Cleaning member holder 43 includes support plate 47 and standing wall plate 48. Support plate 47 is a plate-like member disposed in a horizontal direction, and opening section 53 through which cleaning head 42 passes is formed in a center thereof. Standing wall plates 48 are plate-like members disposed in a vertical direction, and are formed at both end sections of support plate 47. As shown in FIG. 2, first bearing 51a that supports first shaft 51 and second bearing 52a that supports second shaft 52 are disposed at standing wall plate 48. In addition, support plate 47 of cleaning member holder 43 has, on a front surface side thereof, replacement support part 54 that receives support by lift 15 for replacing cleaning member holder 43 with new one. Replacement support part 54 is an insertion hole into which lift 15 is inserted. In addition, fixing part 55 that receives fixing section 58 disposed in base section 44 is provided on a side surface side of cleaning member holder 43. Fixing part 55 is an insertion hole into which fixing section 58 is inserted.

Base section 44 is a member that detachably fixes cleaning member holder 43 at a fixing position. Base section 44 has wall sections in four directions, and has a space which is formed by the wall sections and allows cleaning member holder 43 to enter. Base section 44 is disposed such that cleaning head 42 can be lifted and lowered at a central portion of the space. In addition, base section 44 has moving wall section 57 and fixing section 58. Moving wall section 57 is a member in which cleaning driving section 46 is disposed and which approaches and separates away from cleaning member holder 43. Moving wall section 57 is moved between a drive position and a drive releasing position by driving section 65 (refer to FIG. 5) which is an actuator of cleaning driving section 46 (refer to FIGS. 5A and 5B to be described later). Fixing section 58 is a member that is formed at moving wall section 57 and positions and fixes cleaning member holder 43 while engaging with a part (fixing part 55) of cleaning member holder 43. In base section 44, when moving wall section 57 is at the drive releasing position, cleaning member holder 43 can be lifted and lowered; when moving wall section 57 is at the drive position, cleaning member holder 43 is positioned and a drive force of motor 61 is transmitted to first shaft 51 via connecting section 62.

Figure 5A:
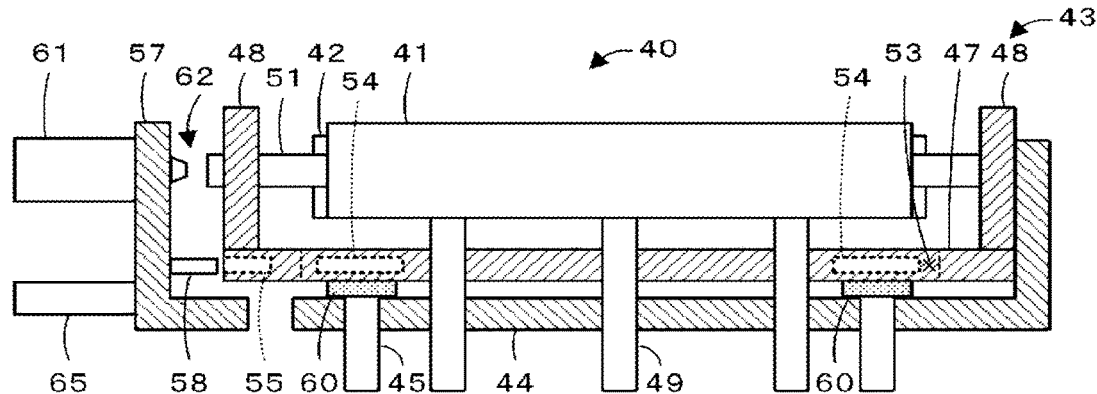
FIG. 5 is an explanatory view showing an example of an operation of cleaning section 40.
Figure 5B:
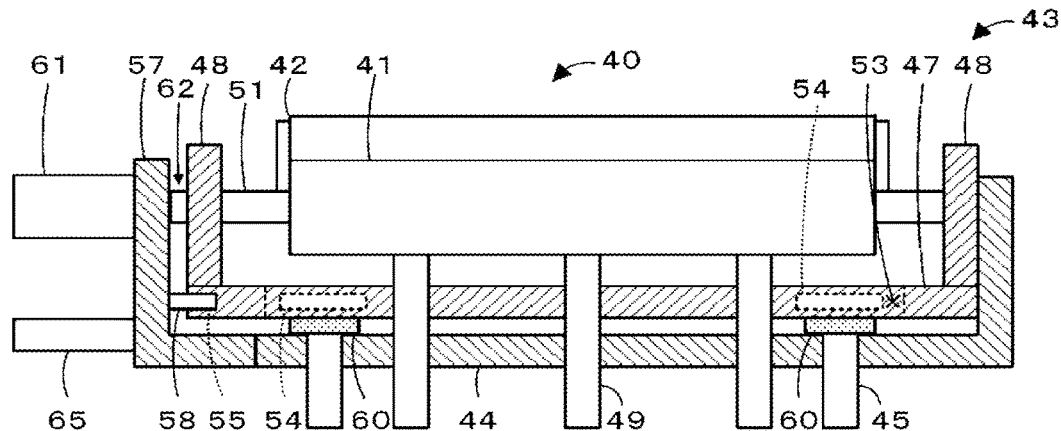
Figure 5C:
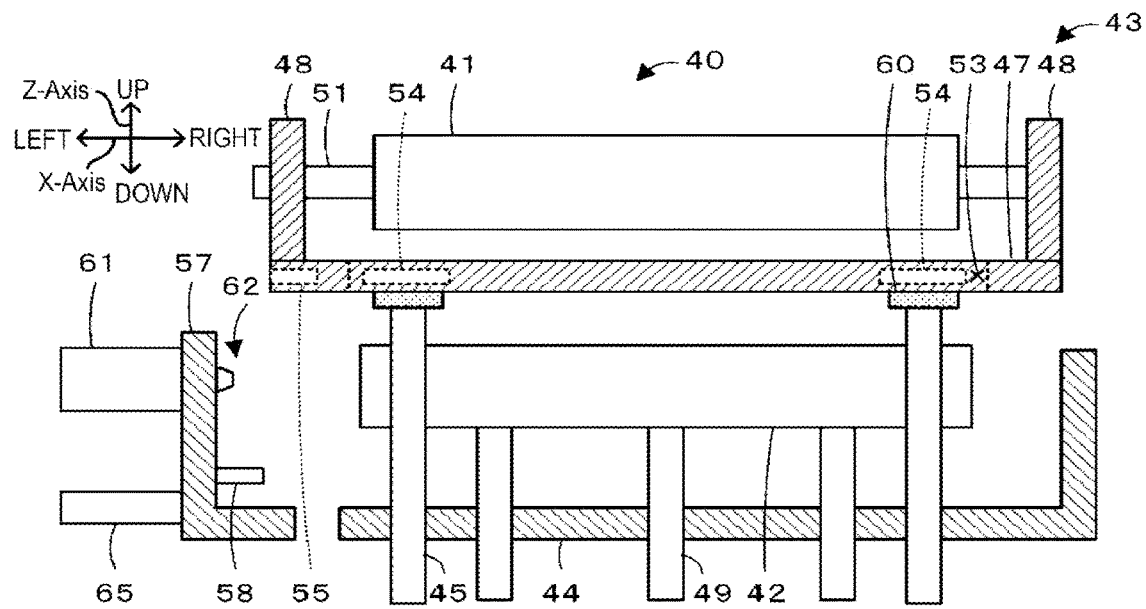

Holder moving section 45 moves cleaning member holder 43 between the fixing position of base section 44 and a replacing position where cleaning member holder 43 is detached from base section 44 and is unloaded to the outside (refer to FIGS. 5B and 5C to be described later). Holder moving section 45 lifts and lowers cleaning member holder 43 with an actuator (not shown). Holder moving section 45 has pickup section 60 that comes into contact with cleaning member holder 43. Pickup section 60 fixes (picks up) the cleaning member holder by, for example, a magnetic force. Holder moving section 45 lifts and lowers cleaning member holder 43 to move cleaning member holder 43 between the fixing position and the replacing position.

Cleaning driving section 46 drives first shaft 51 to wind. Cleaning driving section 46 includes motor 61, connecting section 62, and driving section 65. Motor 61 rotatably drives first shaft 51 via connecting section 62. Connecting section 62 is a mechanism that connects and disconnects first shaft 51 in cleaning member holder 43. As shown in FIG. 2B, connecting section 62 transmits a drive force of motor 61 to first shaft 51, for example, as contact surface 63 of a rotating member directly connected to motor 61 and wall surface 64 of a rotating member directly connected to first shaft 51 come into contact with each other. Connecting section 62 may transmit the drive force through a friction force, or may transmit the drive force with a gear mechanism. Driving section 65 is an actuator that moves moving wall section 57. When driving section 65 moves moving wall section 57 to the drive position, connecting section 62 is connected and the drive force of motor 61 is transmitted to first shaft 51.

Figure 6:
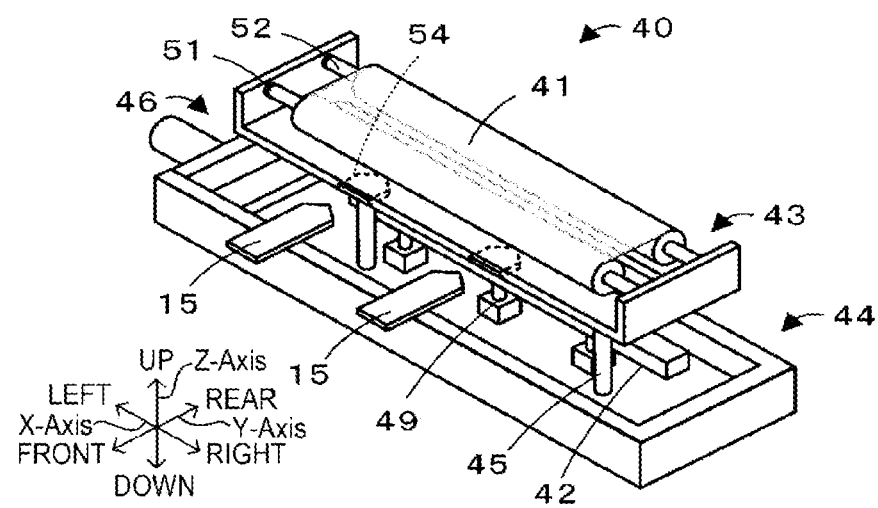
FIG. 6 is an explanatory view for exchanging cleaning member holder 43 of cleaning section 40.

Next, an operation of printing device 11 configured as described above, in particular, an operation of cleaning section 40 will be described. FIG. 5 is an explanatory view showing an example of the operation of the cleaning section 40; FIG. 5A is a view in which moving wall section 57 is at a disconnection position, FIG. 5B is a view in which cleaning member holder 43 is at the fixing position and moving wall section 57 is at a connection position, and FIG. 5C is a view in which cleaning member holder 43 is at the replacing position. In addition, FIG. 6 is explanatory view for exchanging cleaning member holder 43 of cleaning section 40. In cleaning section 40 at an initial position, cleaning member holder 43 is at the fixing position and moving wall section 57 is at the disconnection position (FIG. 5A). When a printing process is performed and a predetermined cleaning timing has come, control section 21 drives driving section 65 to move moving wall section 57 to the connection position. Then, in cleaning section 40, fixing section 58 is inserted into fixing part 55, and cleaning member holder 43 is fixed in a positioned state. In addition, motor 61 is connected to first shaft 51 via connecting section 62. Then, control section 21 causes head moving section 49 to move cleaning head 42 to the cleaning position (FIG. 5B) such that a lower surface of screen mask M is cleaned. In addition, when the use of cleaning member 41 is completed, control section 21 causes exchange with new cleaning member holder 43 to be performed one by one. Control section 21 causes driving section 65 to move moving wall section 57 to the disconnection position, and causes holder moving section 45 to move cleaning member holder 43 to the replacing position (FIG. 6). At this time, cleaning head 42 passes through opening section 53 so as to be removed from cleaning member holder 43. Then, lift 15 is inserted from storage device 14 into replacement support part 54, and cleaning member holder 43 is stored in storage device 14. Similarly, new cleaning member holder 43 is supported and moved by lift 15, and is moved to the fixing position by holder moving section 45 while being fixed by pickup section 60. In this manner, in cleaning section 40, cleaning member 41 is automatically exchanged by lift 15.

Herein, a correspondence relationship between components of the present embodiment and components of the present disclosure will be clarified. Cleaning member 41 of the present embodiment corresponds to a cleaning member, cleaning head 42 corresponds to a cleaning head, cleaning member holder 43 corresponds to a cleaning member holder, base section 44 corresponds to a base section, holder moving section 45 corresponds to a holder moving section, and cleaning driving section 46 corresponds to a cleaning driving section.

In cleaning section 40 of the present embodiment described hereinbefore, cleaning member holder 43, that supports first shaft 51 and second shaft 52, over which cleaning member 41 cleaning screen mask M is bridged, and has opening section 53, through which cleaning head 42 can pass, is detachably fixed at the fixing position to base section 44. Then, when cleaning screen mask M, cleaning section 40 causes cleaning head 42 to pass through opening section 53 formed in cleaning member holder 43 to bring cleaning member 41 into contact with screen mask M, and causes cleaning driving section 46 to drive cleaning member 41 to wind, thereby cleaning screen mask M. On the other hand, when exchanging cleaning member 41, cleaning section 40 disconnects cleaning driving section 46 with connecting section 62, and causes holder moving section 45 to move cleaning member holder 43 that supports first shaft 51 and second shaft 52, over which cleaning member 41 is bridged, to the replacing position. At this time, since cleaning head 42 passes through opening section 53 and separates away from cleaning member holder 43, cleaning member holder 43 is in a free state. Then, in cleaning section 40, since it is possible to replace cleaning member 41 together with cleaning member holder 43, the cleaning member 41 used for printing device 11 can be more easily exchanged.

In addition, cleaning member holder 43 has support plate 47, in which opening section 53 is formed, and standing wall plates 48, which are formed at both end sections of support plate 47 and in which first bearing 51a supporting first shaft 51 and second bearing 52a supporting second shaft 52 are formed. In cleaning section 40, cleaning member holder 43, which has support plate 47 and standing wall plates 48, allows easier exchange of cleaning member 41. Further, base section 44 has moving wall section 57, in which cleaning driving section 46 is disposed and which approaches and separates away from cleaning member holder 43, and fixing section 58, which is formed in moving wall section 57 and positions and fixes cleaning member holder 43 while engaging with a part of cleaning member holder 43. In cleaning section 40, through approaching and separating of moving wall section 57 having fixing section 58, the connection and disconnection of cleaning driving section 46 and the fixing and positioning of cleaning member holder 43 can be simultaneously performed. Further, cleaning member holder 43 has replacement support part 54 that receives the support by lift 15 for replacing cleaning member holder 43 with new one. In cleaning section 40, lift 15 can replace cleaning member 41 with new one.

In addition, cleaning driving section 46 has connecting section 62 that transmits a drive force to first shaft 51 as contact surface 63 of the rotating member directly connected to motor 61 and wall surface 64 on a first shaft side come into contact with each other. In cleaning section 40, a drive force of cleaning driving section 46 can be transmitted to first shaft 51 through surface contact at connecting section 62. Then, holder moving section 45 moves cleaning member holder 43 by fixing cleaning member holder 43 with pickup section 60 which picks up cleaning member holder 43 by a magnetic force. In cleaning section 40, since cleaning member holder 43 is fixed using pickup section 60, positional deviation when moving cleaning member holder 43 can be further suppressed. In addition, in cleaning section 40, since fixation can be easily released by pickup section 60, the replacement of cleaning member holder 43 can be more easily performed. Further, the cleaning head is lifted and lowered to bring cleaning member 41 into contact with screen mask M from the lower surface side thereof; cleaning member holder 43 has opening section 53 through which lifted and lowered cleaning head 42 passes; holder moving section 45 lifts and lowers cleaning member holder 43 to move cleaning member holder 43 between the fixing position and the replacing position; cleaning driving section 46 moves in the horizontal direction such that connecting section 62 connects and disconnects to and from first shaft 51. Cleaning section 40 configured as described above can perform exchange more easily. In addition, since printing device 11 includes cleaning section 40 described above, cleaning member 41 used for printing device 11 can be more easily exchanged. In addition, in printing device 11, an effect in accordance with a form of cleaning section 40 adopted as described above can be achieved.

A cleaning unit and a printing device of the present disclosure are not limited to the embodiment described above, and it is evident that the cleaning unit and the printing device can be implemented in various forms without departing from the technical scope of the present disclosure.

For example, cleaning member holder 43 includes support plate 47 and standing wall plate 48 in the embodiment described above; however, the configuration is not particularly limited to this shape insofar as first shaft 51 and second shaft 52 can be supported.

Although base section 44 includes moving wall section 57 and fixing section 58 in the embodiment described above, any one or more of the sections may be omitted. Even if any one of the sections is omitted, cleaning member 41 can be exchanged more easily.

Replacement support part 54, into which lift 15 is inserted, is formed in cleaning member holder 43 in the embodiment described above; however, the configuration is not particularly limited to the insertion hole insofar as replacement support part 54 receives lift 15. For example, the replacement support part may be a groove section that receives lift 15. Alternatively, replacement support part 54 may be omitted from cleaning member holder 43.

Figures 7A, 7B:
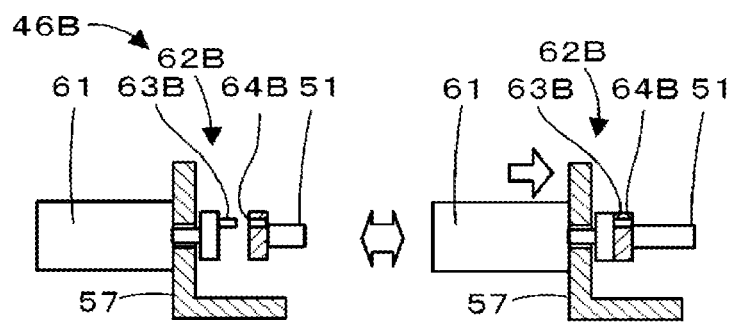
FIG. 7 is an explanatory view of connecting section 62B of another cleaning driving section 46B.

Cleaning driving section 46 includes connecting section 62 which performs surface contact in the embodiment described above; however, the configuration is not particularly limited to this. FIG. 7 is an explanatory view of connecting section 62B of another cleaning driving section 46B. In connecting section 62B, connecting pin 63B is formed at the rotating member directly connected to motor 61, and insertion hole 64B, into which connecting pin 63B is inserted, is formed on a first shaft 51 side. Also with connecting section 62B, motor 61 can be connected and disconnected.

Holder moving section 45 has pickup section 60 that fixes cleaning member holder 43 by a magnetic force in the embodiment described above; however, the configuration is not particularly limited to this insofar as cleaning member holder 43 can be fixed. For example, the pickup section may fix cleaning member holder 43 by a negative pressure. Alternatively, holder moving section 45 may fix cleaning member holder 43 through a method other than pickup, for example, through engagement between members.

Printing device 11 including cleaning section 40, which is a cleaning unit, is described in the embodiment described above; however, the configuration is not particularly limited to this, and only the cleaning unit may be distributed.

INDUSTRIAL APPLICABILITY

The present disclosure is applicable to the technical field of devices for performing a component mounting process.

REFERENCE SIGNS LIST 10 mounting system, 11 printing device, 12 mounting device, 14 storage device, 15 lift, 18 management PC, 21 control section, 22 printing section, 23 printing head, 24 printing moving section, 25 squeegee, 26 mask operation section, 28 mask fixing section, 30 board processing section, 31 board conveyance section, 32 supply section, 33 cartridge, 40 cleaning section, 41 cleaning member, 42 cleaning head, 43 cleaning member holder, 44 base section, 45 holder moving section, 46, 46B cleaning driving section, 47 support plate, 48 standing wall plate, 49 head moving section, 51 first shaft, 51a first bearing, 52 second shaft, 52a second bearing, 53 opening section, 54 replacement support part, 55 fixing part, 57 moving wall section, 58 fixing section, 60 pickup section, 61 motor, 62, 62B connecting section, 63 contact surface, 63B connecting pin, 64 wall surface, 64B insertion hole, 65 driving section, M screen mask, S board.

The invention claimed is:
1. A cleaning unit that is used for a printing device configured to perform a viscous fluid printing process on a printing target using a screen mask, the cleaning unit comprising:
a cleaning head configured to move a cleaning member for cleaning the screen mask between a cleaning position where the cleaning member is brought into contact with the screen mask and a standby position, and to clean the screen mask at the cleaning position;
a cleaning member holder configured to support a first shaft and a second shaft, over which the cleaning member is bridged, the cleaning member holder having an opening section allowing the cleaning head to pass therethrough;
a base section configured to detachably fix the cleaning member holder at a fixing position;
a holder moving section configured to move the cleaning member holder between the fixing position of the base section and a replacing position where the cleaning member holder is detached from the base section and is unloaded to an outside; and
a cleaning driving section having a connecting section configured to connect and disconnect to and from the first shaft in the cleaning member holder, the cleaning driving section driving the first shaft to wind.

2. The cleaning unit according to claim 1,
wherein the cleaning member holder has a support plate having the opening section and standing wall plates being formed at both end sections of the support plate and having a first bearing supporting the first shaft and a second bearing supporting the second shaft.

3. The cleaning unit according to claim 1,
wherein the base section has a moving wall section to which the cleaning driving section is provided and which approaches and separates away from the cleaning member holder, and a fixing section formed at the moving wall section, the fixing section being configured to position and fix the cleaning member holder while engaging with a part of the cleaning member holder.

4. The cleaning unit according to claim 1,
wherein the cleaning member holder has a replacement support part configured to receive support by a lift configured to perform replacement of the cleaning member holder.

5. The cleaning unit according to claim 1,
wherein the cleaning driving section has the connecting section configured to transmit a drive force to the first shaft as a contact surface and a wall surface on a first shaft side come into contact with each other.

6. The cleaning unit according to claim 1,
wherein the holder moving section moves the cleaning member holder by fixing the cleaning member holder with a pickup section configured to pick up the cleaning member holder.

7. The cleaning unit according to claim 1,
wherein the cleaning head is lifted and lowered to bring the cleaning member into contact with the screen mask from a lower surface side of the screen mask,
the cleaning member holder has the opening section allowing the cleaning head being lifted and lowered to pass therethrough,
the holder moving section moves the cleaning member holder between the fixing position and the replacing position by lifting and lowering the cleaning member holder, and
the cleaning driving section moves in a horizontal direction and connects and disconnects the connecting section to and from the first shaft.

8. A printing device comprising:
the cleaning unit according to claim 1; and
a printing section configured to perform a viscous fluid printing process on a printing target using the screen mask.

* * * * *